United States Patent [19]
Suzuki et al.

[11] Patent Number: 5,351,360
[45] Date of Patent: Oct. 4, 1994

[54] CLEANING DEVICE FOR A WAFER MOUNT PLATE

[75] Inventors: Shizuo Suzuki, Oume; Noriyoshi Yokosuka, Iruma, both of Japan

[73] Assignee: Enya Systems, Limited, Japan

[21] Appl. No.: 893,775

[22] Filed: Jun. 5, 1992

[30] Foreign Application Priority Data

Jun. 6, 1991 [JP] Japan .................. 3-160904

[51] Int. Cl.$^5$ ............................................. A46B 13/04
[52] U.S. Cl. ................................... 15/302; 15/77;
15/88.2; 15/88.3; 15/97.1; 15/102; 15/308;
15/311; 134/902
[58] Field of Search ............... 15/77, 88.2, 302, 308,
15/311, 97.1, 102, 88.3; 134/95.2, 153, 902

[56] References Cited

U.S. PATENT DOCUMENTS

| | | | |
|---|---|---|---|
| 2,874,395 | 2/1959 | Blash ........................... | 15/77 |
| 3,479,222 | 11/1969 | David et al. ................ | 15/302 |
| 3,970,471 | 7/1976 | Bankes et al. .............. | 134/902 |
| 4,202,071 | 5/1980 | Scharpf ....................... | 134/153 |
| 4,208,760 | 6/1980 | Dexter et al. ............... | 15/302 |
| 4,694,527 | 9/1987 | Yoshizawa ................... | 134/95.2 |
| 5,092,011 | 3/1992 | Gommori et al. ............ | 15/77 |
| 5,144,711 | 9/1992 | Gill, Jr. ....................... | 15/77 |
| 5,203,360 | 4/1993 | Nguyen et al. .............. | 134/153 |

FOREIGN PATENT DOCUMENTS

| | | | |
|---|---|---|---|
| 2285502 | 4/1976 | France ........................ | 15/77 |
| 16626 | 1/1988 | Japan .......................... | 15/77 |
| 304732 | 12/1989 | Japan .......................... | 134/902 |
| 281733 | 11/1990 | Japan .......................... | 134/902 |

*Primary Examiner*—David A. Scherbel
*Assistant Examiner*—Mark Spisich
*Attorney, Agent, or Firm*—Bruce L. Adams; Van C. Wilks

[57] ABSTRACT

A cleaning device for cleaning adhesive particles and other foreign matter from a disk-shaped wafer mount plate used in semiconductor fabrication comprises a plurality of support rollers supporting the wafer mount plate horizontally for rotation about its own axis. One or more driving rollers are brought into frictional contact with the peripheral side surface of the wafer mount plate to rotationally drive the same. An upper surface washing brush, a lower surface washing brush and a side surface washing brush are movable into brushing contact with the upper, lower and peripheral side surfaces, respectively, of the wafer mount plate for simultaneously brushing all the surfaces thereof while a washing liquid is sprayed thereon. Then rinsing liquid is sprayed on the wafer mount plate, which is thereafter dried by blowing drying gas thereon.

19 Claims, 9 Drawing Sheets

CLEANING DEVICE FOR A WAFER MOUNT PLATE

BACKGROUND OF THE INVENTION

(1) Field of the Invention

The present invention relates to a cleaning device for a wafer mount plate used for polishing semiconductor wafers, and more particularly to a cleaning device for washing the whole surface of the wafer mount plate.

(2) Background of the Invention

In the fabrication of semiconductors, it is requires to make the surface of semiconductor wafers extremely smooth. In general, wafers are pasted on a mount plate by means of an adhesive, such as wax diluted by a solvent, and the mount plate is set on a polishing machine to polish the wafers. This general method is described, for example, in U.S. Pat. No. 4,960,485 issued Oct. 2, 1990. However, if the adhesive between the wafers and the mount plate is not applied thinly and uniformly, minute unevenness is formed on the surface when polishing is conducted and it becomes difficult to obtain high precision.

Further, if fine dust or other minute particles exist, on the surface of the mount plate, the adhesive tends to form dimples at the areas where the dust or particles are located thereby preventing uniform adhesion of the wafers. To avoid this problem, after completion of the polishing operation, the wafers are peeled from the mount plate, and the mount plate is thoroughly washed so that the adhesive and the like does not remain as dust.

Since the mount plate is repeatedly used for the polishing step, the mount plate is made of a material, such as ceramics or a glass, which undergoes small deformation with respect to age deterioration and load. Various kinds of disks, each having a diameter of several tens of centimeters and a thickness of about 20 millimeters, are prepared for use as mount plates so that various kinds of wafers having different sizes may be pasted thereon. The weight on these mount plates is typically from about 20 kg to 30 kg or more.

At present, as a device for cleaning the mount plate, there is known a device in which the mount plate is washed while it is being transported and before pasting the wafers thereon. Such a device comprises upper and lower laterally elongated cylindrical brush rolls extending across a conveying path of the mount plate, so that the upper and lower surfaces of the mount plate can be washed by brushing when the mount plate passes between the brush rolls. However, since the diameter of the mount plate is relatively large as mentioned above, the brush rolls must have a length longer than the diameter of the mount plate. As a consequence, if a part of the brush roll is curved or bowed even a little, it sometimes causes a part of the surface of the mount plate to remain unwashed.

Further, since the peripheral side surface (edge surface) of the mount plate can not be washed by this prior art device, the adhesive remaining on this portion tends to peel off in powdery form during mounting of the wafers upon the mount plate. The powdery adhesive adheres on the mounting surface of the plate and causes formation of dimples in the subsequent adhesive coating step.

In addition, in order to remove the adhesive by washing, it is necessary to carry out the steps of first removing the adhesive, then brushing the surface with pure water, and finally rinsing the surface. Thus, the device tends to become large in size, which is a drawback because the device can not be manufactured economically.

Another device is known in which the mount plated is washed by immersion in organic solvent baths. This device comprises a heated organic solvent bath, a normal temperature organic solvent bath, an organic solvent vapor bath, etc., wherein the mount plate is sequentially immersed in each bath to wash it, followed by drying. However, since the surface of the mount plate is not brushed, the washing or cleaning effect is insufficient. In addition, since the mount plate is heavy and large as compared with the wafers, each immersion bath is large and requires a large area for installation.

In recent years, a cleaning method that does not use organic solvent has been sought from the standpoint of reducing air pollution and for safety and hygienic reasons. It is also necessary to improve the conventional devices from these points of view.

SUMMARY OF THE INVENTION

An object of the present invention is to provide a cleaning device for a wafer mount plate in which, before the wafers are pasted on the mount plate for polishing, the steps of removing the adhesive adhered to the mount plate, washing the mount plate with pure water and drying it, are all conducted at one position without occupying a large space.

Another object of the present invention is to provide a cleaning device for a wafer mount plate which can wash the whole surface of the wafer mount plate.

A further object of the present invention is to provide a cleaning device for cleaning a wafer mount plate and which can readily be adapted to automation.

According to the present invention, the above and other objects can be accomplished by a cleaning device for a wafer mount plate wherein the mount plate is rotatably mounted on a set of support rollers, and an upper surface washing brush, a lower surface washing brush and a side surface washing brush are brought into slidable brushing contact with the upper surface, lower surface and peripheral side surface of the mount plate, respectively, while rotating the mount plate around its own axis to simultaneously brush clean the respective surfaces, followed by blowing a drying gas onto the surfaces to dry them.

Other objects, features and advantages of the present invention will become apparent to those skilled in the art upon a reading of the following description with reference to the accompanying drawings.

DETAILED DESCRIPTION OF THE PREFERRED EMBODIMENTS

Figure 1:
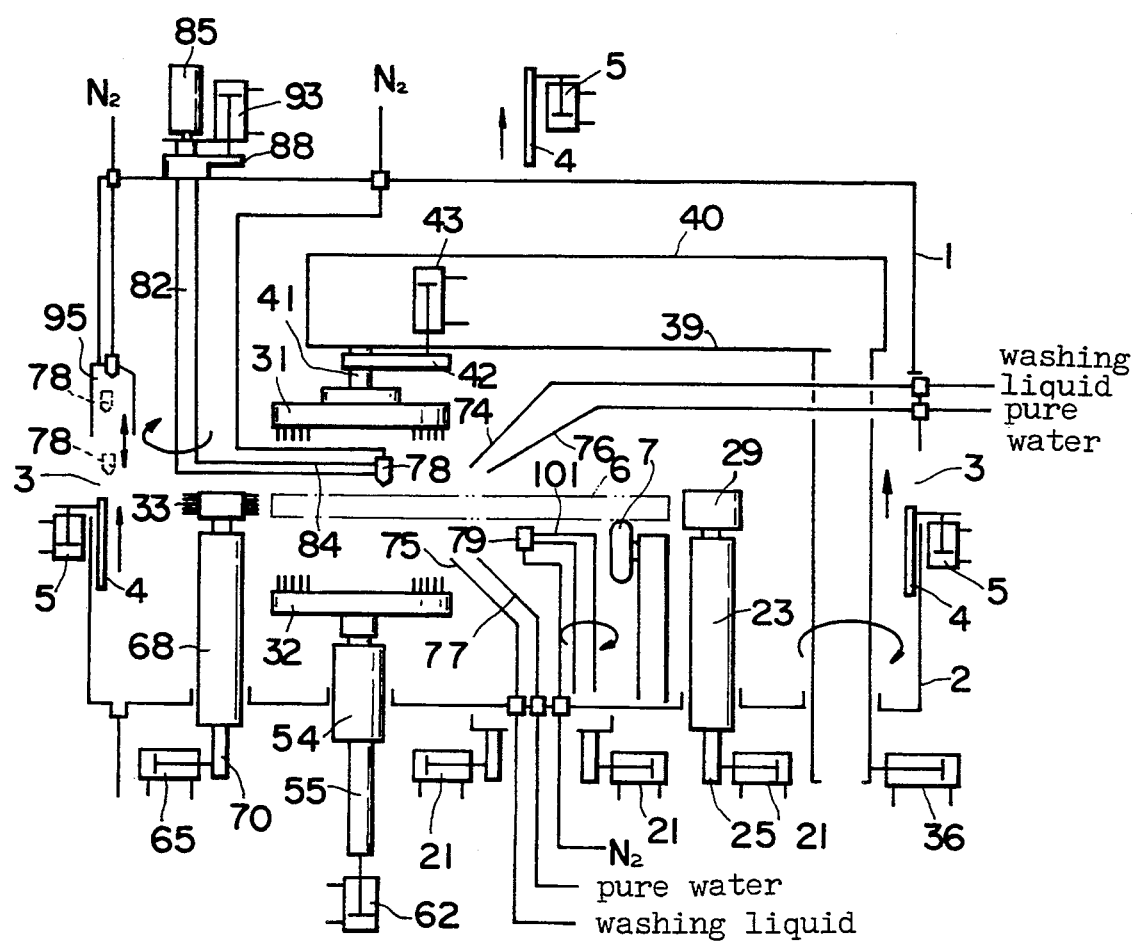
FIG. 1 is a schematic structural view of a cleaning device for a wafer mount plate according to the present invention.
Figure 2:
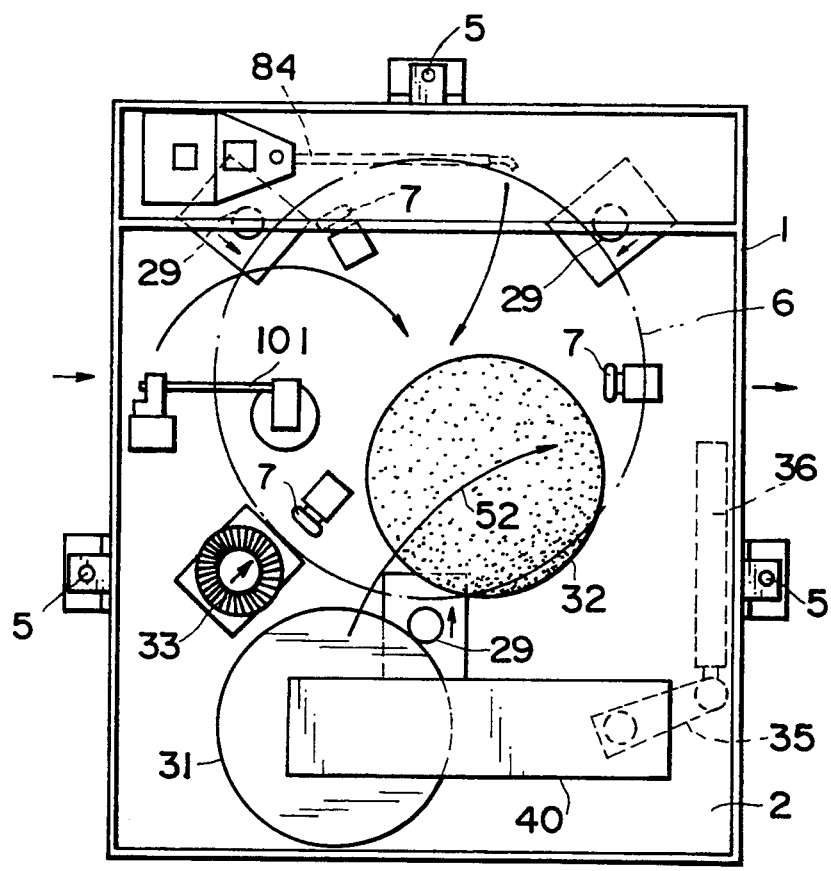
FIG. 2 is a top plan view of the device of the present invention wherein the cover of the device is detached.
Figure 3:
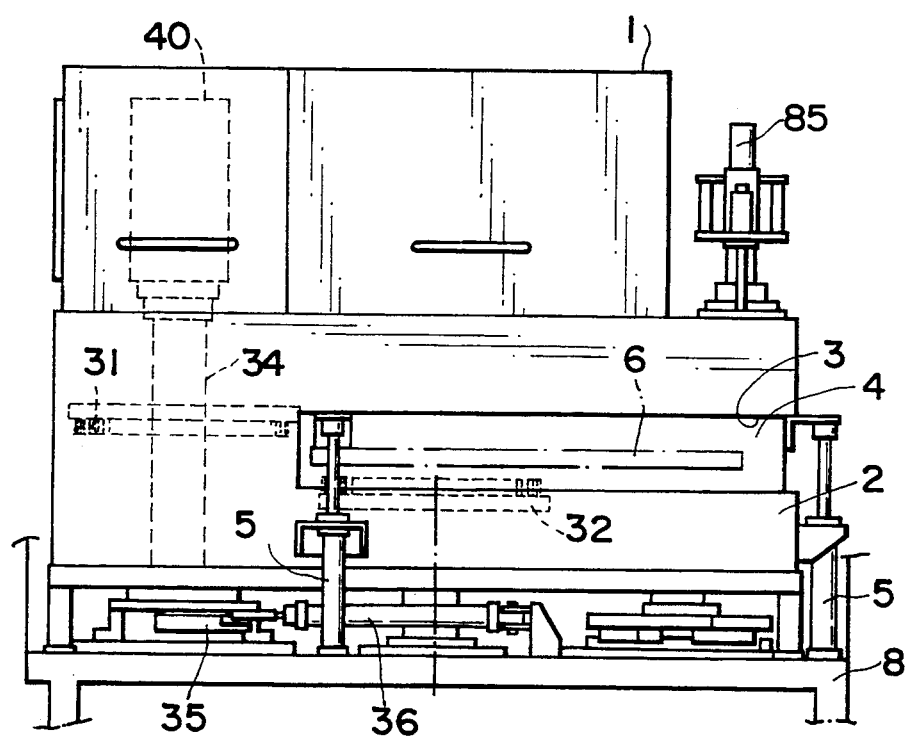
FIG. 3 is a side view of the device of the present invention.

FIG. 1 shows a schematic structural view of one embodiment of a cleaning device for a wafer mount plate according to the present invention, FIG. 2, a plan view, and FIG. 3, a side view. In these drawings, a body 1 defines an enclosed cleaning chamber having at the lower portion thereof a sink 2 which collects and discharges cleaning liquid, etc., and at the upper portion thereof a cover for hermetically covering the cleaning chamber. An opening 3 is formed around both sides and the back of the body 1 to permit loading and unloading of wafer mount plates into and from the cleaning chamber. A movable shutter 4 is provided for covering the opening 3. The opening 3 is opened or closed by moving the shutter 4 up and down by means of actuators, such as air cylinders 5.

When the opening 3 is open, a wafer mount plate 6 is transported into the cleaning chamber of the body 1 by means of an appropriate robot (not shown) and rotatably supported on a set of support rollers 7 so that the mount plate 6 can be rotated around its own axis while supported by the rollers 7 in a horizontal condition. The support rollers 7 are disposed at at least three circumferentially spaced positions in the circumferential direction of the mount plate 6, though additional support rollers 7 may be disposed at other positions.

Figure 4:
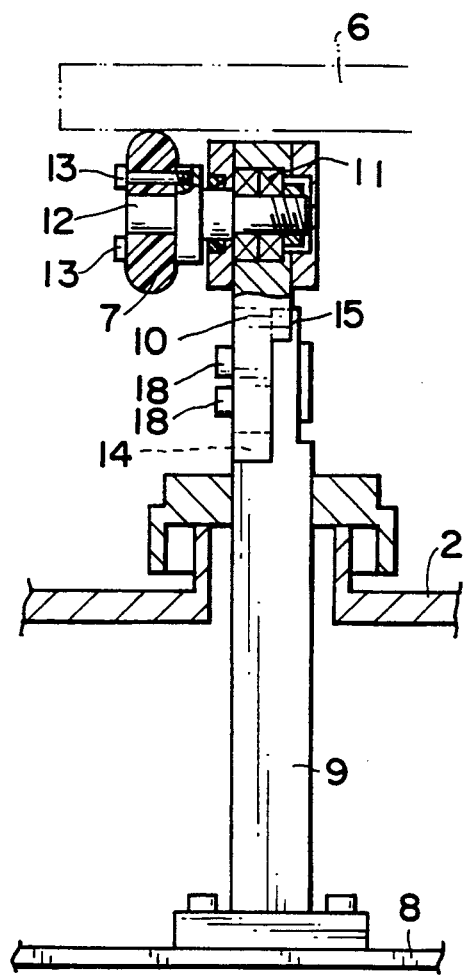
FIG. 4 is a front view, partially in cross section, of a support roller section of the device of the present invention.
Figure 5:
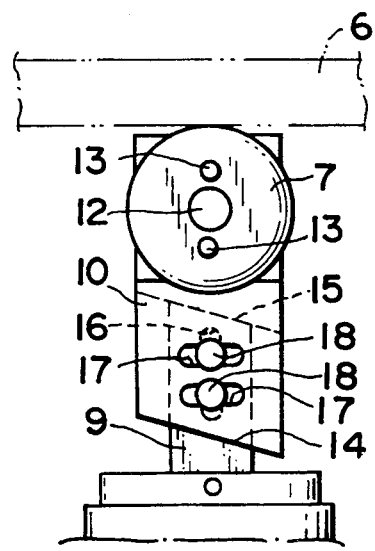
FIG. 5 is a side view of a part of the support roller section of FIG. 4.

As shown in FIGS. 4 and 5, each support roller 7 is rotatably mounted by mounting means comprising a frame 8 which supports an upstanding supporting rod 9, the supporting rod 9 having a housing 10 disposed at the upper portion thereof. The housing 10 has a shaft 12 rotatably disposed by way of a bearing 11, and the support roller 7 is removably attached by belts 13 to an end of the shaft 12. The support roller 7 is preferably made of a synthetic resin material having a high chemical resistance, such as polyvinylidene fluoride (PVDF), and, as the roller becomes abraded during use, it may be easily replaced with a new one by simply unfastening the bolts 13.

Further, as shown in FIG. 5, the lower end of the housing 10 and the upper end of the supporting rod 9 are engaged by way of inclined surfaces 14 and 15. The supporting rod 9 has a longitudinally elongated fitting slit 16, and the housing 10 has a pair of laterally elongated fitting slits 17 intersecting with the fitting slit 16. A bolt 18 is inserted through each pair of intersecting fitting slits 16,17 where they overlap one another to releasably secure the housing 10 to the supporting rod 9. Thus, by loosening the bolts 18 and moving the housing 10 right or left along the inclined surfaces, the height of the support roller 7 can be adjusted up or down.

The wafer mount plate 6 can be rotated around its own axis by rotationally driving one or more of the support rollers 7. Alternatively, separate driving rollers may be used to rotationally drive the wafer mount plate 6. In this embodiment, three driving rollers are brought into contact with the peripheral side surface of the mount plate 6 at three circumferentially spaced locations to rotate the mount plate.

Figure 6:
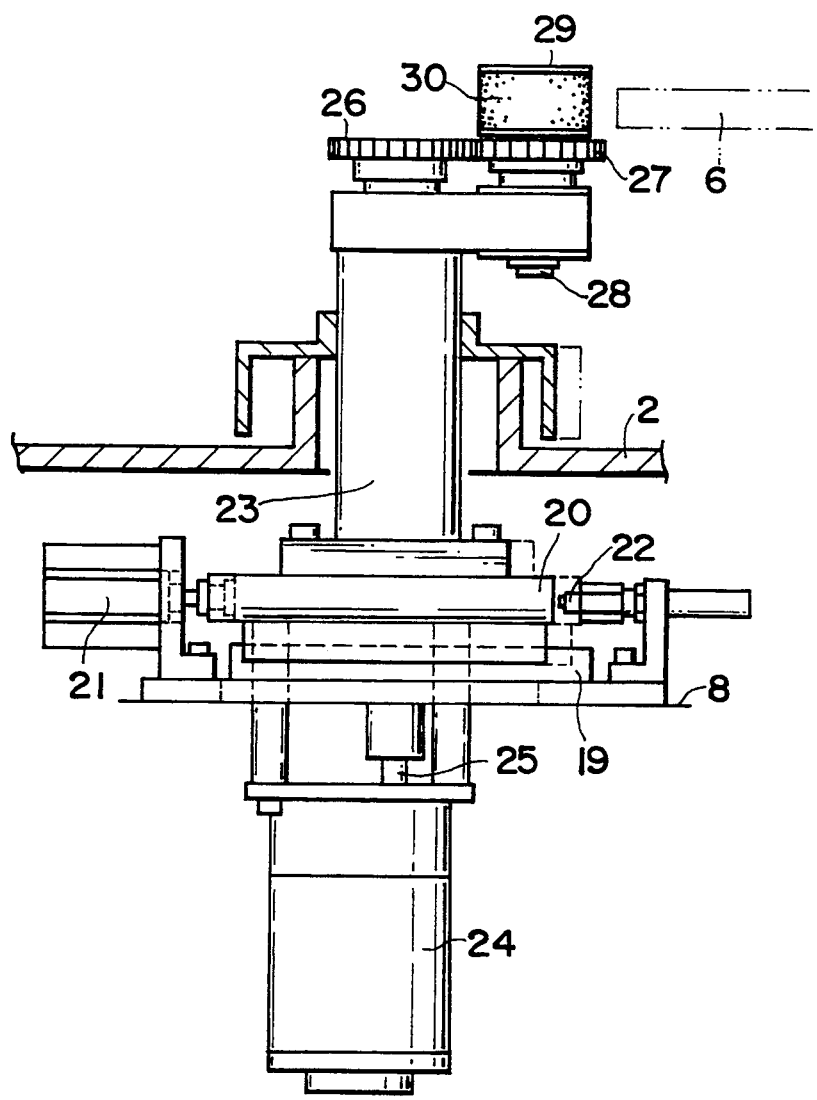
FIG. 6 is a front view of a driving roller section of the device of the present invention.
Figure 7:
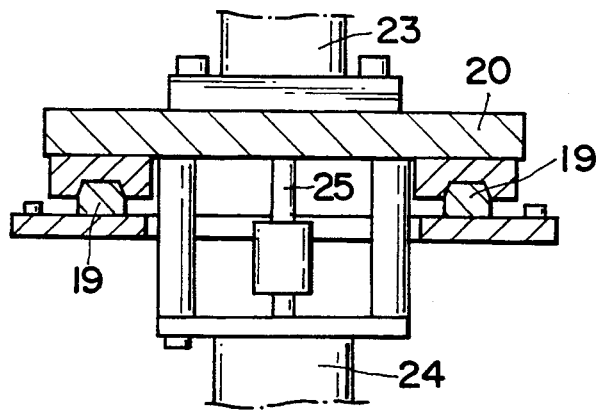
FIG. 7 is a sectional side view of a rail part of the driving roller section of FIG. 6.

FIGS. 6 and 7 show an embodiment of one driving roller unit. On a pair of rails 19 disposed on the frame 8, a slide base 20 is slidably mounted so that the slide base 20 may be moved radially toward and away from the center of the mount plate 6 (the rightward and leftward directions in FIG. 6) by means of an air cylinder 21. A buffering member 22 is disposed to contact one end of the slide base 20 to absorb the impact thereof when the driving roller unit is moved into contact with the mount plate 6. A driving shaft 25 is connected to be rotationally driven by a rotary motor 24 and extends upwardly through a housing 23. The driving shaft 25 rotates a roller shaft 28 by means of gears 26 and 27 disposed at the upper portion of the driving shaft 25, thereby rotating a driving roller 29 disposed on the roller shaft 28.

On the periphery of the driving roller 29, a lining layer 30 made of an elastic material, such as synthetic rubber or a soft synthetic resin material, is disposed. It is preferred to prepare a family of driving rollers having different diameters so that plural mount plates having different diameters can be used. As shown in FIG. 2, the driving rollers 29 are disposed at three circumferentially spaced locations around the periphery of the mount plate 6, but may be disposed at more than three locations. Also, some of the rollers 29 may be used as non-driving rollers, for example, as guide rollers.

An upper surface washing brush 31, a lower surface washing brush 32 and a side surface washing brush 33 are disposed so as to be movable into slidable brushing contact with the upper surface, the lower surface and the peripheral side surface, respectively, of the wafer mount plate 6 mounted on the support rollers 7.

Figure 8:
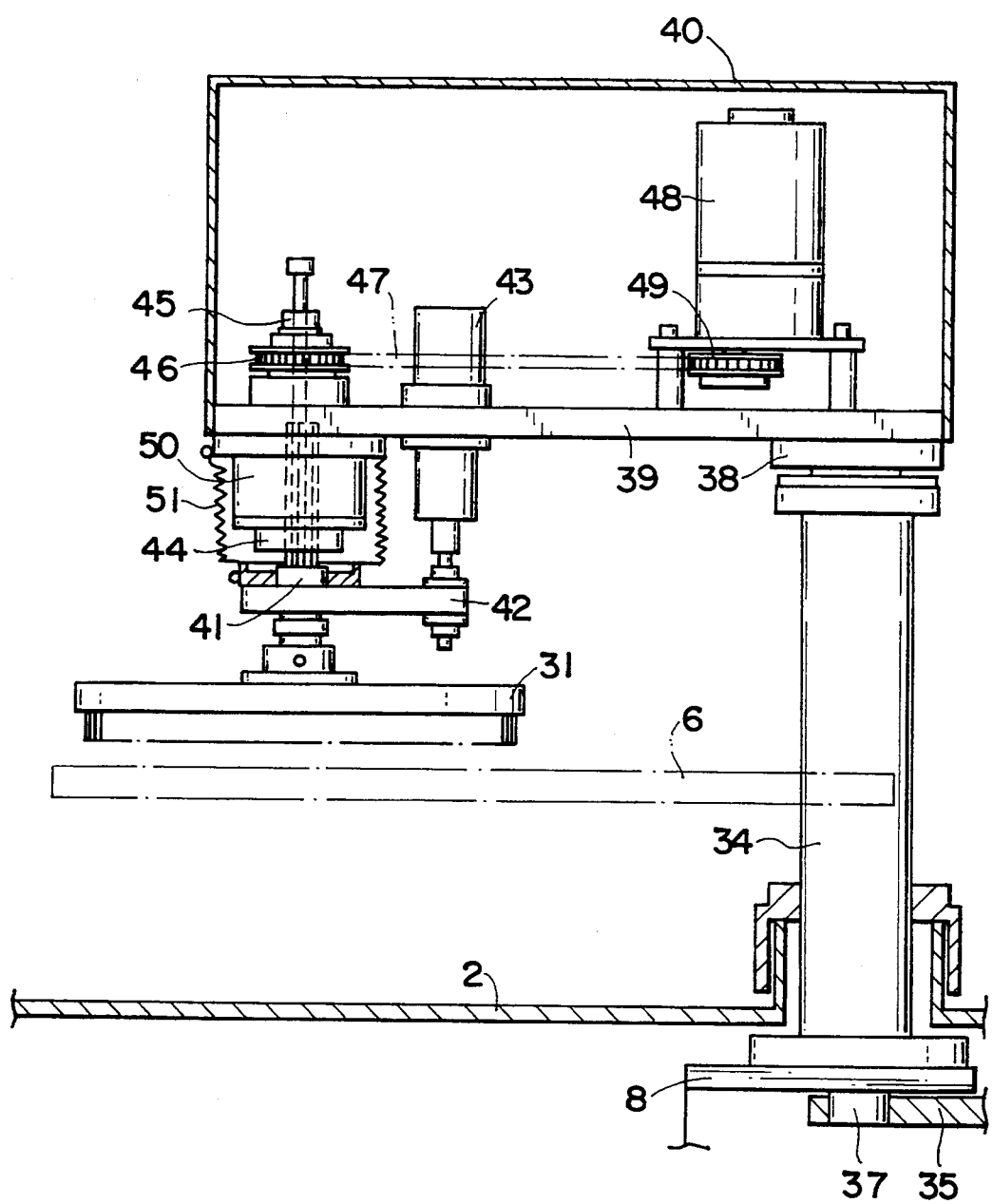
FIG. 8 is a front view of an upper surface washing brush section of the device of the present invention.

FIG. 8 shows one embodiment of the upper surface washing brush 31. In this embodiment, a main shaft 37 is inserted through a stand 34 standing on the frame 8. The main shaft 37 is rotated by a motor, such as an air cylinder 36 (FIGS. 1 to 3), by way of a link 35. At the top of the main shaft 37, an arm 39 is fixed by way of a flange 38. The periphery of the arm 39 is covered by a cover 40.

A cylinder 43 is carried by the arm 39 for moving up and down a lift plate 42 which rotatably supports a shaft 41 of the upper surface washing brush 31. The washing brush 31 is in the form of a disk-like plate having bristles projecting downwardly from the lower surface thereof. A part of the shaft 41 is formed as a spline shaft which engages with a ball spline 44. A timing pulley 46 is fixed to a shaft holder 45 having the ball spline 44 at the lower end thereof. The timing pulley 46 is connected through a timing belt 47 to a timing pulley 49 attached to a rotary motor 48. A housing 50, which rotatably supports the shaft holder 45, is fixed to the lower surface of the arm 39 and is surrounded by a bellows 51.

By such a construction, the upper surface washing brush 31 can be rotated by the motor 48 and moved up and down by the cylinder 43. In addition, the upper surface washing brush 31 can be turned in the arrow direction 52 in FIG. 2 by operating the air cylinder 36.

Figure 9:
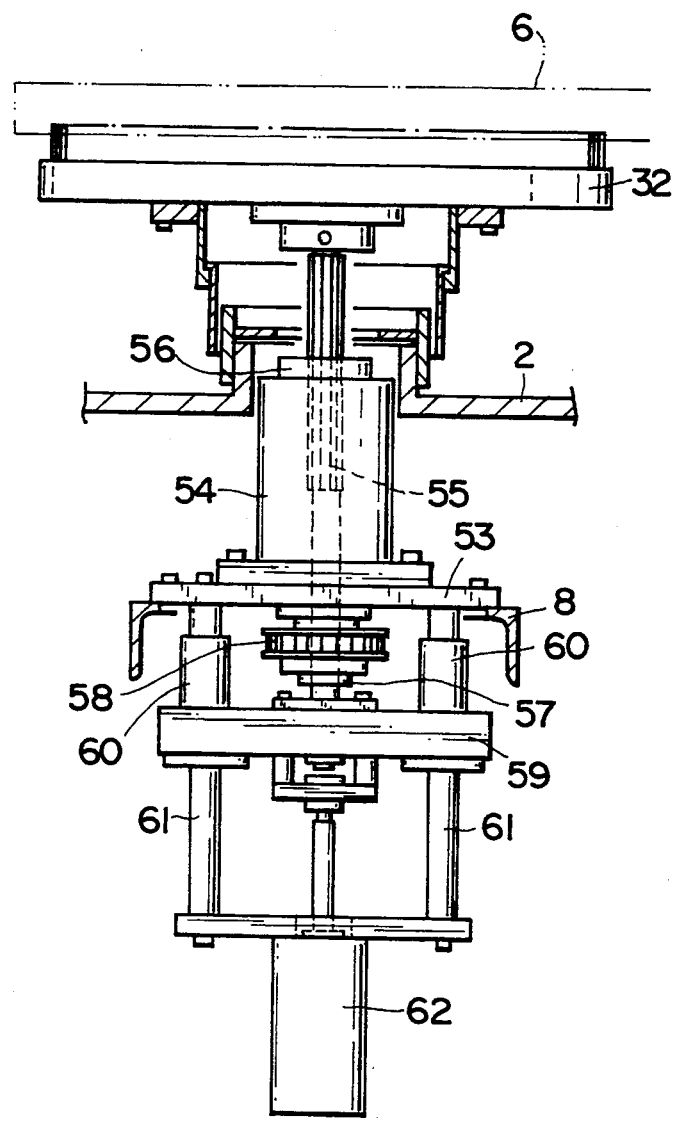
FIG. 9 is a front view of a lower surface washing brush section of the device of the present invention.

FIG. 9 shows one embodiment of the lower surface washing brush 32. A housing 54 stands on a base 53 disposed on the frame 8, and a spline shaft 55 extends through the housing 54. Between the spline shaft 55 and the housing 54, a shaft holder 57 is rotatably disposed. The shaft holder 57 has at the upper end thereof a ball spline 56 engaging with the spline shaft 55. To a timing pulley 58 disposed at the lower end of the shaft holder 57, a motor (not shown) is connected by way of a timing belt and a pulley (not shown) in a manner similar to that shown in FIG. 8.

The lower end of the spline shaft 55 is rotatably connected to a vertically displaceable bearing holder 59. The bearing holder 59 is guided by means of a slide bush 60 and a guide shaft 61, and the bearing holder 59 is moved up and down by the operation of an air cylinder 62. The upper end of the spline shaft 55 is connected to the washing brush 32, which comprises a disk-like plate having bristles projecting upwardly from the upper surface thereof.

By the above structure, the lower surface washing brush 32 is rotated by a motor (not shown) and is moved up and down by the cylinder 62. The lower surface washing brush 32 may be turned similarly as the upper surface washing brush 31.

Figure 10:
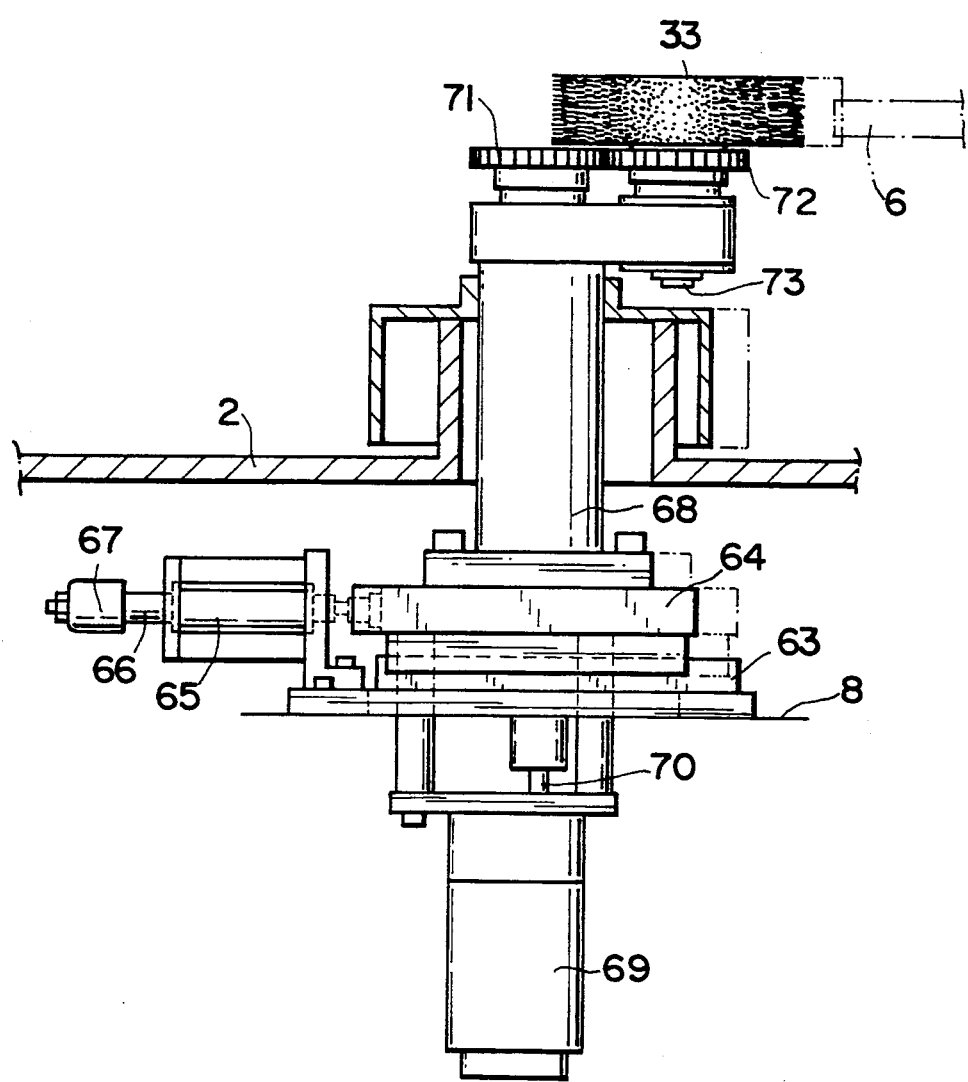
FIG. 10 is a front view of a side surface washing brush section of the device of the present invention.

FIG. 10 shows one embodiment of the side surface washing brush 33, which has basically a similar structure as the driving roller unit shown in FIGS. 6 and 7. Namely, on a rail 63 provided on the frame 8, a slide base 64 is slidably mounted in such a way that the slide base 64 may be moved radially toward and away from the center of the mount plate 6 by means of an air cylinder 65. The range of movement of the slide base 64 is restricted by a stopper 67 attached to a rod 66 of the air cylinder 65. A housing 68 is supported on the slide base 64, and a driving shaft 70 extends through the housing 68 and is connected to be rotationally driven by a motor 69. A brush shaft 73 is rotated by way of gears 71 and 72 which are driven by the driving shaft 70, thereby rotating the side surface washing brush 33 which is attached to the brush shaft 73.

The side surface washing brush 33 comprises a disk-Like plate, which is thicker than the mount plate 6, having bristles projecting radially outwardly from the periphery thereof. Plural side surface washing brushes having different diameters are provided so that plural mount plates having different diameters may be used.

Adjacent each of the upper and lower surfaces of the mount plate 6, nozzles 74 and 75 for supplying washing liquid and nozzles 76 and 77 for supplying rinsing liquid, for example, pure water, are disposed as shown in FIG. 1. In order to dry the washed mount plate 6, nozzles 78 and 79 are provided for supplying a drying gas, such as air or nitrogen. The drying gas, such as air or nitrogen gas, may be appropriately heated. The respective nozzles may be of a fixed type or a turning type. In the embodiment shown in the drawings, the nozzles 78 and 79 for blowing nitrogen gas are of the turning type, and the other nozzles 74, 75, 76 and 77 are of the fixed type.

If the adhesive to be used for the wafers is soluble in an aqueous alkali solution, such as a resin comprising as a main component a tricylic compound typified by abietic acid such as resin, a derivative of the resin, or a modified product of the resin with a dibasic acid, or a mixture of two or more of them, the washing liquid should preferably be an aqueous solution, such as an organic alkali, inorganic alkali or inorganic alkali salt, or a mixture of two or more of them.

Figure 11:
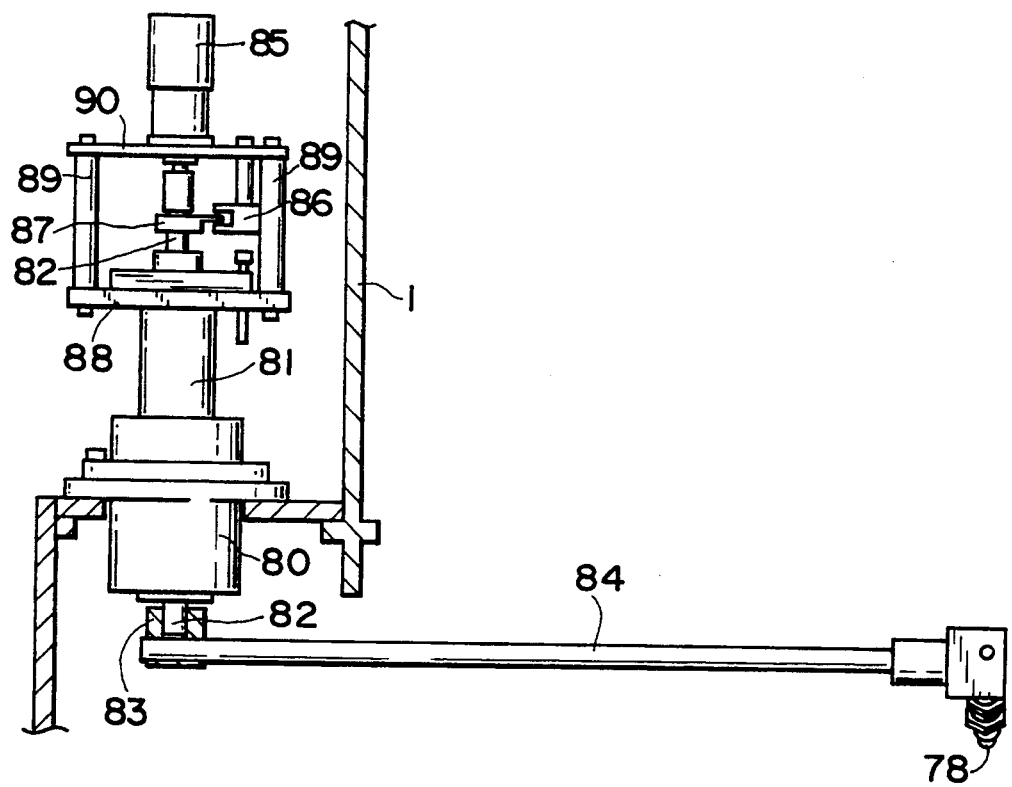
FIG. 11 is a front view of an upper nozzle section of the device of the present invention.
Figure 12:
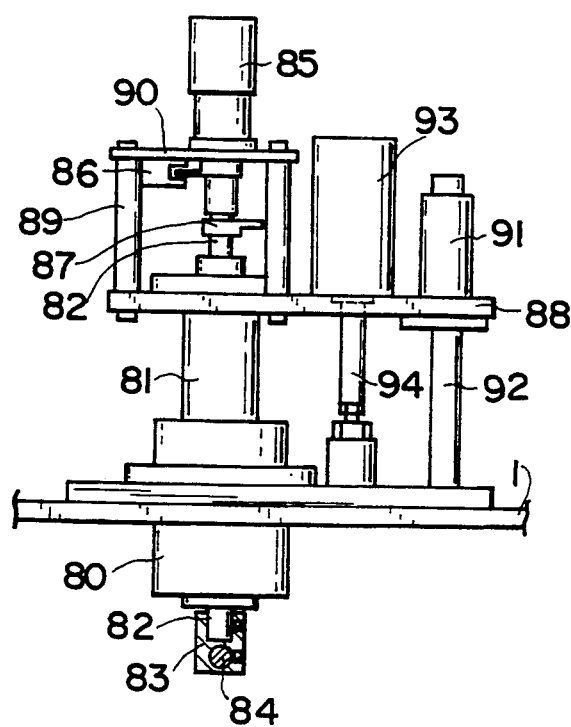
FIG. 12 is a side view of the upper nozzle section of FIG. 11.

FIGS. 11 and 12 show one embodiment of the upper nozzle assembly which includes the upper nozzle 78. As shown, a slide bush 80 is fixed to the body 1, and a bearing holder 81 is slidably inserted in the slide bush 80 to undergo up and down movement. In the bearing holder 81, a shaft 82 is pivotally supported. At the lower end of the shaft 82, a nozzle shaft 84 is fixed by way of a nozzle holder 83. At the distal end of the nozzle shaft 84 is disposed the nozzle 78.

The upper end of the shaft 82 is connected to a motor 85 which pivots or turns the shaft 82. A sensor 86 is provided to control the range of turning movement of the nozzle 78. The sensor 86 may be, for example, an optical sensor having spaced apart light-emitting and light-receiving elements. In this embodiment, the sensor 86 is fixedly mounted and coacts with a sensor activating member 87 connected to turn with the shaft 82. As the shaft 82 turns, the sensor activating member 87 moves between the light-emitting and light-receiving elements, thereby activating the sensor 86 and stopping the motor 85. The range of turning movement of the shaft 82 is thus restricted by the operation of the sensor 86.

At the upper end of the bearing holder 81 is fixed an elevating plate 88. On the elevating plate 88, a motor plate 90, which supports the motor 85 by way of a supporting column 89, is fastened. At one end of the elevating plate 88, a slide bush 91 is disposed as shown in FIG. 12, and a guide shaft 92 is slidably inserted through the slide bush 91. A rod 94 of an air cylinder 93 disposed on the elevating plate 88 is fixed at its end to the body 1. By the operation of the cylinder 93, the nozzle 78 is moved up and down by way of the elevating plate 88, bearing holder 81 and shaft 82.

The upper nozzle 78 may be turned back to a non-working position under the condition that the shaft 82 is moved down. At the turned-back position, the upper nozzle 78 is displaced out of the cleaning zone and contained in a cover section 95 disposed in the body 1 under the condition that the upper nozzle 78 is moved up as shown by chain lines in FIG. 1. By blowing a drying gas, such as nitrogen, into the cover section 95, the upper nozzle 78 can be dried.

Figure 13:
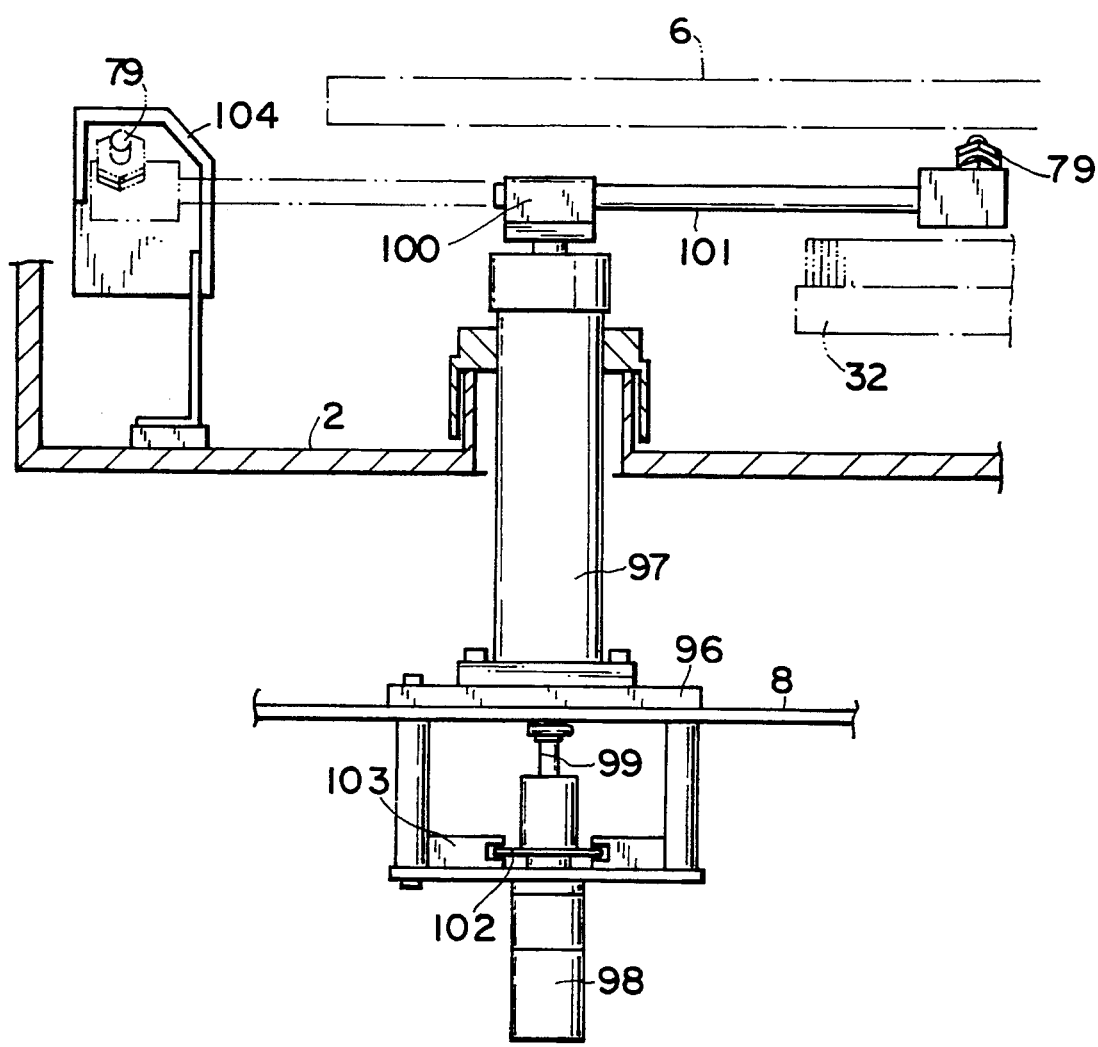
FIG. 13 is a front view of a lower nozzle section of the device of the present invention.

FIG. 13 shows one embodiment of the lower nozzle assembly which includes the lower nozzle 79. A base 96 is fastened to the frame 8 and supports an upstanding housing 97. A shaft 99 extends through the housing 97 and is pivoted or turned by a motor 98. At the upper end of the shaft 99, a nozzle shaft 101 is disposed by way of a nozzle holder 100. At the end of the nozzle shaft 101 is disposed the nozzle 79. The nozzle shaft 101 is turned by means of the motor 98, and the range of turning is controlled by a sensor activating member 102 and a sensor 103. The lower nozzle 79 can be turned back to a non-working position, and, at the turned-back position, the lower nozzle 79 is contained in a cover section 104 disposed in the body 1.

The operation of the cleaning device will next be described. To load a wafer mount plate, the shutter 4 of the opening 3 is opened, and a wafer mount plate 6 is transported into the cleaning chamber and mounted on the support rollers 7 by means of a robot (not shown) following which the shutter 4 is closed. The driving rollers 29 are brought into frictional contact with the periphery of the mount plate 6 by the cylinder 21 to clamp the mount plate therebetween. The driving rollers 29 are rotationally driven to rotate the mount plate around its own axis at an appropriate angular speed, preferably from about several tens to about 100 rpm. As the mount plate 6 is rotated, all the surfaces thereof are exposed for cleaning.

While washing liquid is supplied from the nozzle 74, the upper surface washing brush 31 is rotated by the motor 48 and moved downwardly by the cylinder 43 into brushing contact with the upper surface of the mount plate 6. Then, while spraying the washing liquid onto the lower surface of the mount plate 6 from the nozzle 75, the lower surface washing brush 32 and the side surface washing brush 33 are rotated and brought into brushing contact with the mount plate 6 by means of the cylinders 62 and 65. During the washing cycle, the upper surface washing brush 31 and the lower surface washing brush 32 are each rotated in opposite directions.

After the foreign matter adhered to the surfaces of the mount plate 6, for example, adhesive such as a wax, has been removed, the supply of the washing liquid is terminated, and pure water is supplied from the nozzles 76 and 77 to rinse the mount plate surfaces. The washing and rinsing cycles are conducted for as long as needed to clean the surfaces of the mount plate 6.

Then, the lower surface washing brush 32 and the side surface washing brush 33 are moved back by means of the cylinders 62 and 65, and the upper surface washing brush 31 is moved back by means of the cylinders 36 and 43. Then the upper nozzle 78 and the lower nozzle 79 are turned into the cleaning zone, and drying gas, such as nitrogen, is blown by the nozzles 78,79 onto the mount plate 6 to dry the whole surface of the mount plate.

After completion of the above-mentioned steps, the shutter 4 of the opening 3 is again opened, and the cleaned mount plate 6 is removed from the cleaning chamber by the robot, and then another mount plate is loaded therein for cleaning. These steps are repeated to automatically wash the mount plates sequentially.

The cleaning device of the present invention is constituted as described above, wherein the wafer mount plate is rotated around its own axis on a set of support rollers and washed by brushing simultaneously the upper surface and lower surface as well as the side surface thereof. Further, by using washing liquid composed of an aqueous alkali solution, the washing can be conducted safely and hygienically without using organic solvent, and the cost is about one-tenth of the case where organic solvent is used. Also, the size of the cleaning device is about one-third as compared with the conventional device having rows of brushes therein, and thus the device can be installed in a small space. In addition, by changing the driving rollers and side surface washing brush with ones of different sizes, it is possible to wash mount plates having different diameters.

We claim:

1. A cleaning device for cleaning a wafer mount plate, comprising: supporting means for rotatably supporting a wafer mount plate having upper and lower surfaces bounded by a peripheral side surface to undergo rotation in a generally horizontal plane such that all the surfaces of the wafer mount plate are exposed during rotation of the wafer mount plate, the supporting means including a set of rotatable rollers for rotatably supporting thereon the lower surface of the wafer mount plate, the rollers being positioned beneath the wafer mount plate about a given axis and rotatably supporting the wafer mount plate for rotation about the given axis; driving means for rotationally driving the wafer mount plate; supplying means for supplying washing liquid to the surfaces of the wafer mount plate during rotation thereof; and brushing means for brushing simultaneously the upper, lower and peripheral side surfaces of the wafer mount plate while the washing liquid is being supplied thereto.

2. A cleaning device according to claim 1; wherein the driving means includes means for rotationally driving at least one of the rollers constituting the supporting means to thereby rotationally drive the wafer mount plate about the given axis.

3. A cleaning device according to claim 1; wherein the driving means includes at least one rotationally driven driving roller engageable with the peripheral side surface of the wafer mount plate to rotationally drive the wafer mount plate about the given axis.

4. A cleaning device according to claim 3; including displaceable mounting means mounting the driving roller for movement into and out of engagement with the peripheral side surface of the wafer mount plate; and means for displacing the mounting means to move the driving roller into and out of engagement with the wafer mount plate.

5. A cleaning device according to claim 3; wherein the driving means includes a plurality of rotationally driven driving rollers engageable with the peripheral side surface of the wafer mount plate at different locations to jointly effect rotational driving of the wafer mount plate.

6. A cleaning device according to claim 1; wherein the brushing means comprises an upper surface washing brush movable into brushing contact with the upper surface of the wafer mount plate, a lower surface washing brush movable into brushing contact with the lower surface of the wafer mount plate, and a side surface washing brush movable into brushing contact with the peripheral side surface of the wafer mount plate.

7. A cleaning device according to claim 6; including means mounting the upper, lower and side surface washing brushes for movement into and out of brushing contact with the upper, lower and peripheral side surfaces, respectively, of the wafer mount plate.

8. A cleaning device according to claims 6; including means rotatably mounting the upper, lower and side surface washing brushes; and means for rotating the upper, lower and side surface washing brushes.

9. A cleaning device according to claim 6; including plural side surface washing brushes each movable into brushing contact with the peripheral side surface of the wafer mount plate at different locations therearound.

10. A cleaning device according to claim 1; wherein the driving means includes at least one rotationally driven driving roller engageable with the peripheral side surface of the wafer mount plate to rotationally drive the wafer mount plate.

11. A cleaning device according to claim 1; including means including plural nozzles for directing drying gas onto the wafer mount plate.

12. A cleaning device according to claim 11; including means mounting the nozzles for movement toward and away from the wafer mount plate.

13. A cleaning device according to claim 11; wherein one of the nozzles is disposed to direct drying gas onto the upper surface of the wafer mount plate and another of the nozzles is disposed to direct drying gas onto the lower surface of the wafer mount plate.

14. A cleaning device for cleaning a wafer mount plate, comprising: supporting means for rotatably supporting a wafer mount plate having upper and lower surfaces bounded by a peripheral side surface to undergo rotation in a generally horizontal plane such that all the surfaces of the wafer mount plate are exposed during rotation of the wafer mount plate; driving means for rotationally driving the wafer mount plate; supplying means for supplying washing liquid to the surfaces of the wafer mount plate during rotation thereof; and brushing means for brushing simultaneously the upper, lower and peripheral side surface of the wafer mount plate while the washing liquid is being supplied thereto, wherein the brushing means comprises an upper surface washing brush movable into brushing contact with the upper surface of the wafer mount plate, a lower surface washing brush movable into brushing contact with the lower surface of the wafer mount plate, and a side surface washing brush movable into brushing contact with the peripheral side surface of the wafer mount plate.

15. A cleaning device according to claim 14; including plural side surface washing brushes each movable into brushing contact with the peripheral side surface of the wafer mount plate at different locations therearound.

16. A cleaning device according to claim 14; including means for supplying rinsing liquid to the surfaces of the wafer mount plate during rotation thereof.

17. A cleaning device according to claim 16; including means including plural nozzles for directing drying gas onto the wafer mount plate.

18. A cleaning device according to claim 17; including means mounting the nozzles for movement toward and away from the wafer mount plate.

19. A cleaning device according to claim 17; wherein one of the nozzles is disposed to direct drying gas onto the upper surface of the wafer mount plate and another of the nozzles is disposed to direct drying gas onto the lower surface of the wafer mount plate.

* * * * *